United States Patent
Gardner et al.

[11] Patent Number: 6,080,640
[45] Date of Patent: Jun. 27, 2000

[54] METAL ATTACHMENT METHOD AND STRUCTURE FOR ATTACHING SUBSTRATES AT LOW TEMPERATURES

[75] Inventors: Mark I. Gardner, Cedar Creek; Fred Hause; Daniel Kadosh, both of Austin, all of Tex.

[73] Assignee: Advanced Micro Devices, Inc., Austin, Tex.

[21] Appl. No.: 09/045,324

[22] Filed: Mar. 20, 1998

Related U.S. Application Data

[62] Division of application No. 08/890,377, Jul. 11, 1997.
[51] Int. Cl.[7] .............................. H01L 21/30; H01L 21/46
[52] U.S. Cl. ................................................. 438/455
[58] Field of Search ............................................ 438/455

[56] References Cited

U.S. PATENT DOCUMENTS

| | | |
|---|---|---|
| 4,818,728 | 4/1989 | Rai et al. . |
| 5,710,460 | 1/1998 | Leidy et al. . |
| 5,780,121 | 7/1998 | Endo . |
| 5,780,874 | 7/1998 | Kudo . |
| 5,804,494 | 9/1998 | Mitani et al. . |

OTHER PUBLICATIONS

Wolf, S., Silicon Processing for the VLSI Era, vol. II, Lattice Press, pp. 189–190, 1990.

*Primary Examiner*—John F. Niebling
*Assistant Examiner*—Josetta I. Jones
*Attorney, Agent, or Firm*—Jenkens & Gilchrist A Professional Corporation

[57] ABSTRACT

A high density integrated circuit structure and method of making the same includes providing a first silicon substrate structure having semiconductor device formations in accordance with a first circuit implementation and metal interlevel lines disposed on a top surface thereof and a second silicon substrate structure having a second circuit implementation and metal interlevel lines disposed on a top surface thereof. The first substrate structure includes a planarized low-K dielectric disposed between the metal interlevel lines and a protective coating separating the metal interlevel lines from is the low-K dielectric, the metal interlevel lines of the first silicon substrate structure have a melting temperature on the order of less than 500° C. and the low-K dielectric having a dielectric K-value in the range of 2.0–3.8. The second substrate structure also includes a planarized low-K dielectric disposed between the metal interlevel lines and a protective coating separating the metal interlevel lines from the low-K dielectric, the metal interlevel lines having a melting temperature on the order of less than 500° C. and the low-K dielectric having a dielectric K-value in the range of 2.0–3.8. Lastly, the first substrate structure is low temperature bonded to the second substrate structure at respective metal interlevel lines of the first and second substrate structures.

17 Claims, 2 Drawing Sheets

METAL ATTACHMENT METHOD AND STRUCTURE FOR ATTACHING SUBSTRATES AT LOW TEMPERATURES

This application is a divisional of application Ser. No. 08/890,377, filed Jul. 11, 1997.

BACKGROUND OF THE INVENTION

1. Field of the Invention

This invention relates generally to integrated circuits and, more particularly, to a high density, high performance MOSFET structures and method of making the same.

2. Discussion of the Related Art

A field-effect transistor (FET) is a solid state amplifying device. Amplification in the device occurs when the current through two terminals is varied by an electric field arising from voltage applied to a third terminal. The FET is thus a voltage controlled device. In an insulated-gate (IG) type of FET, the controlling field appears at an insulating layer. Variations in the field cause corresponding variations in the current through the device. Because the input or control voltage is applied across an insulator, the FET is further characterized by a high input impedance.

In the IGFET, the channel current is controlled by a voltage at a gate electrode which is isolated from the channel by an insulator. In one common configuration, an oxide layer is grown or deposited on the semiconductor surface, and a polysilicon gate electrode is deposited onto this oxide layer. The resulting structure is commonly called a metal-oxide-semiconductor (MOS) structure. If the device includes a source and drain, it represents an MOS transistor or MOSFET. The MOSFET has the advantage of extremely high input impedance between the gate and source electrodes, since these terminals are separated by an oxide layer. The general term IGFET includes devices in which the insulator may be some material other than an oxide layer.

In further discussion of the above, a MOSFET can be either a depletion device or an enhancement device. The depletion device MOSFET is one in which a channel exists at zero gate voltage. The depletion device is thus referred to as a normally on device. On the other hand, the enhancement device MOSFET is a device which requires a gate voltage to induce a channel and is further referred to as a normally off device. Furthermore, the MOSFET is either an n-channel or a p-channel device, depending upon the carrier type in the channel.

In an n-channel device, the source and drain regions include $n^+$ regions diffused into a high-resistivity p substrate. The channel region may be either a thin diffused n layer or an induced inversion region. In an n-type diffused channel device, the effect of the electric field is to raise or lower the conductance of the channel by either depleting or enhancing the electron density in the channel. When a positive voltage is applied to the gate (i.e., at the oxide-semiconductor interface), an electric field in the oxide layer exists between positive charge on the gate electrode and negative charge in the semiconductor. The negative charge is composed of an accumulation of mobile electrons into the channel and fixed ionized acceptor atoms in the depleted p material. If the gate-to-source voltage is positive, the conductivity of the channel is enhanced, while a negative gate voltage tends to deplete the channel of electrons. Thus a diffused-channel MOSFET can be operated in either the depletion or enhancement modes.

In an induced-channel MOSFET transistor, for an n-channel device, there is no diffused n-type region existing between source and drain at equilibrium. When a positive gate voltage is applied to the structure, a depletion region is formed in the p material, and a thin layer of mobile electrons is drawn from the source and drain into the channel. Where the mobile electrons dominate, the material is effectively n-type. This is called an inversion layer, since the material was originally p-type. Once the inversion layer is formed near the semiconductor surface, a conducting channel exists from the source to the drain. The operation of the device is then quite similar as discussed above. The channel conductance is controlled by the field in the insulator, but the magnitude of this field varies along the channel ($V_{GX}$) from the voltage at the drain ($V_{GS}-V_{DS}$) to the voltage at the source ($V_{GS}$). Since a positive voltage is required between the gate and each point x in the channel to maintain inversion, a large enough value of $V_{DS}$ can cause the field in the insulator to go to zero at the drain. As a result there is a small depleted region at the drain end of the channel through which electrons are injected in the saturation current. Once pinch-off is reached, the saturation current remains essentially constant. A p-channel MOSFET is similar to the n-channel, however, the conductivity types are reversed.

In addition, in the present state of the art, miniaturization of field-effect transistor device dimensions is continually being sought. Several limitations on miniaturization of FET devices have been encountered. For instance, it is extremely difficult to form FETs with the channel other than parallel to the substrate. Thus, the size of the transistor cannot generally be made smaller than the size of the gate or the channel. Furthermore, as the channel is made small, adverse effects on transistor performance occur. Modifications of existing techniques for fabrication of FET device structures introduce performance degradations into fabricated devices and limit performance characteristics of the same.

Fabrication of integrated circuit devices also involves numerous process steps which add to a cost of manufacturing the integrated circuit devices. It would thus be desirable to provide an improved method of making integrated circuit devices by reducing the number of process steps.

In addition to the miniaturization of individual integrated circuit devices, it would also be desirable to increase a packing density of an integrated circuit.

SUMMARY OF THE INVENTION

It is an object of the present invention to increase a packing density of an integrated circuit in which two silicon substrate structures are combined via a low temperature metal attachment method following a desired transistor formation on each of the two silicon substrate structures, in addition to minimizing any adverse capacitive effects.

According to the present invention, a method of making a high density integrated circuit includes the steps of providing a first silicon substrate structure having semiconductor device formations in accordance with a first circuit implementation and metal interlevel lines disposed on a top surface thereof, the first silicon substrate further having a planarized low-K dielectric disposed between the metal interlevel lines and a protective coating separating the metal interlevel lines from the low-K dielectic. The metal interlevel lines have a melting temperature on the order of less than 500° C. The low-K dielectric has a dielectric K-value in the range of 2.0–3.8. A second silicon substrate structure is provided, the second silicon substrate structure having semiconductor device formations in accordance with a second circuit implementation and metal interlevel lines disposed on a top surface thereof, the second silicon substrate further having a planarized low-K dielectric disposed between the metal interlevel lines and a protective coating separating the metal interlevel lines from the low-K dielectric. The metal interlevel lines of the second silicon substrate have a melting temperature on the order of less than 500° C. The low-K dielectric of the second silicon substrate has a dielectric K-value in the range of 2.0–3.8. Lastly, the first silicon substrate structure is low temperature bonded to the second silicon substrate structure at respective metal interlevel lines of the first and second silicon substrate structures.

Further according to the method of the present invention, the low-K dielectric of the first silicon substrate structure includes a low-K dielectric material selected from the group consisting of a deposition type material having a fluorine component and a spin-on type material having a fluorine component.

Still further in accordance with the present invention, a high density integrated circuit includes a first silicon substrate structure and a second silicon substrate structure. The first silicon substrate structure includes semiconductor device formations in accordance with a first circuit implementation and metal interlevel lines disposed on a top surface thereof, the first silicon substrate further having a planarized low-K dielectric disposed between the metal interlevel lines and a protective coating separating the metal interlevel lines from the low-K dielectric. The metal interlevel lines have a melting temperature on the order of less than 500° C. The low-K dielectric has a dielectric K-value in the range of 2.0–3.8. The second silicon substrate structure includes semiconductor device formations in accordance with a second circuit implementation and metal interlevel lines disposed on a top surface thereof, the second silicon substrate further having a planarized low-K dielectric disposed between the metal interlevel lines and a protective coating separating the metal interlevel lines from the low-K dielectric. The metal interlevel lines have a melting temperature on the order of less than 500° C. The low-K dielectric has a dielectric K-value in the range of 2.0–3.8. Lastly, the first silicon substrate structure is bonded to the second silicon substrate structure at respective metal interlevel lines of the first and second silicon substrate structures.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which.

DETAILED DESCRIPTION OF A PREFERRED EMBODIMENT OF THE INVENTION

Turning now to FIGS. 1–4, the method of making a high density integrated circuit formed by low temperature fabrication of a first substrate structure having a transistor formation and metal interlevel lines thereon and a second substrate structure having a transistor formation and metal interlevel lines thereon shall be described with respect to the first substrate structure.

Figure 1:
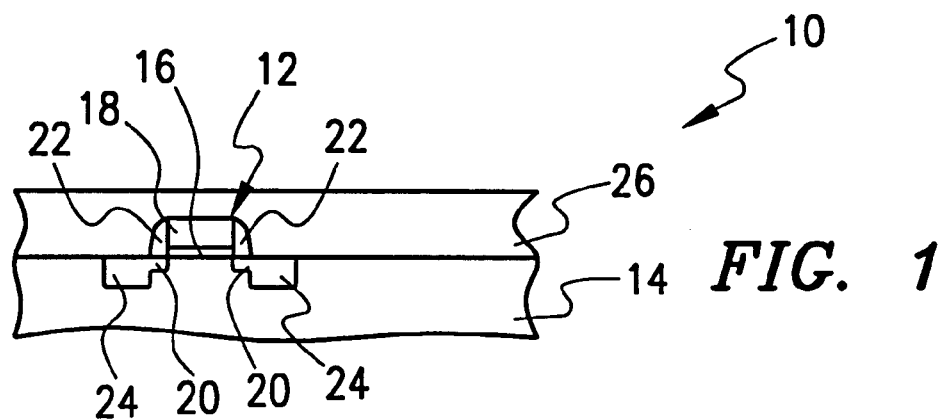
FIGS. 1–3 illustrate steps in the manufacture of a first silicon substrate structure having a transistor formation and metal interlevel lines thereon in preparation for low temperature fabrication of the high density integrated circuit according to the present invention.

In FIG. 1, a first silicon substrate structure 10 includes desired transistor formations thereon, for example, such as high performance transistor formation 12. Structure further includes a substrate 14, preferably silicon, having a thickness on the order of 725 $\mu$m.

The present invention provides for the fabrication of small geometry high performance MOS transistor devices. The range of geometries for high performance MOS transistor devices includes 0.1 to 0.2 microns, with respect to a minimum feature size, such as the high performance transistor gate length. The gate length always represents a minimum speed delay in a transistor from the source to the drain. In addition, the gate length, as used herein, is defined by a length of the gate electrode between a source region and a drain region. Subsequent to a gate oxide 16 and gate conductor 18 formation, well regions are defined in the substrate 14. Additional process steps are then carried out for the formation of lightly doped drains 20, sidewall spacers 22, source/drain regions 24, and desired ion implants of the high performance transistor devices 12 in substrate 14. For instance, high performance transistor devices 12 can be formed using techniques described in copending applications Ser. No. 08/743,643, entitled "HIGH PERFORMANCE MOSFET STRUCTURE HAVING ASYMMETRICAL SPACER FORMATION AND METHOD OF MAKING THE SAME" filed Nov. 4, 1996; Ser. No. 08/791,378, entitled "METHOD OF FORMING A MULTIPLE TRANSISTOR CHANNEL DOPING USING A DUAL RESIST FABRICATION SEQUENCE" filed Jan. 30, 1997; and Ser. No. 08/798,639 entitled "A METHOD OF INTEGRATING LDD IMPLANTATION FOR CMOS DEVICE FABRICATION" filed Feb. 11, 1997, all assigned to the assignee of the present invention. In addition, transistor devices formed in substrate 14 may also include high performance or other transistor devices as may be desired for a particular integrated circuit application.

Subsequent to the transistor formation, a first level dielectric layer 26, such as oxide, is deposited upon the transistor formation 12. The first level dielectric layer 26 is then planarized using suitable planarization techniques known in the art, such as, chemical mechanical polishing. Planarized dielectric layer 26 has a relative thickness in the range on the order 5,000 to 20,000 Å.

Figure 2:
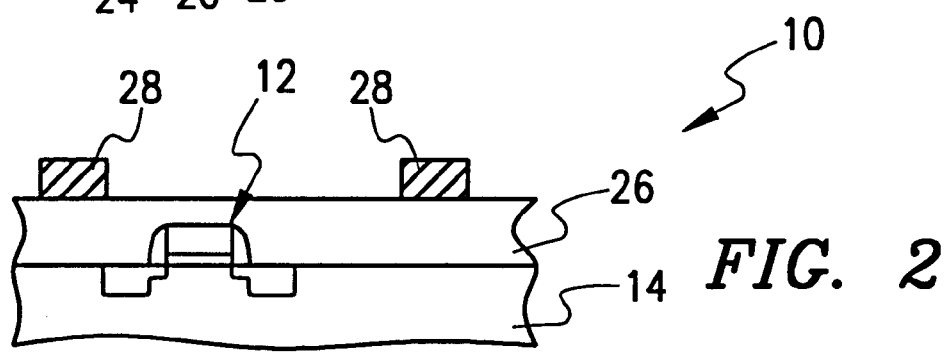
Figure 3:
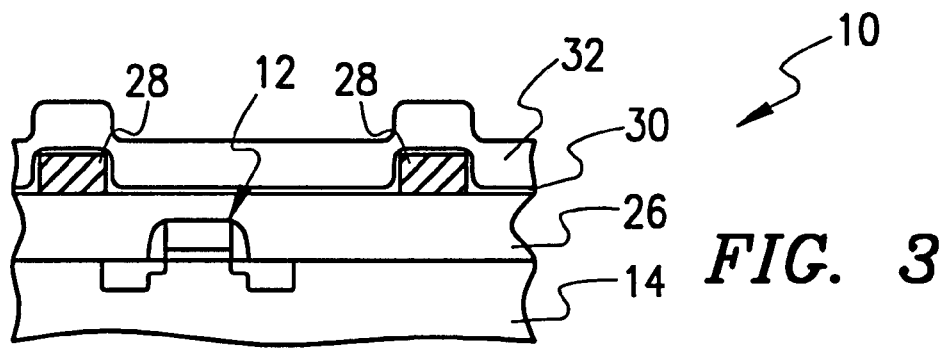
Figure 4:
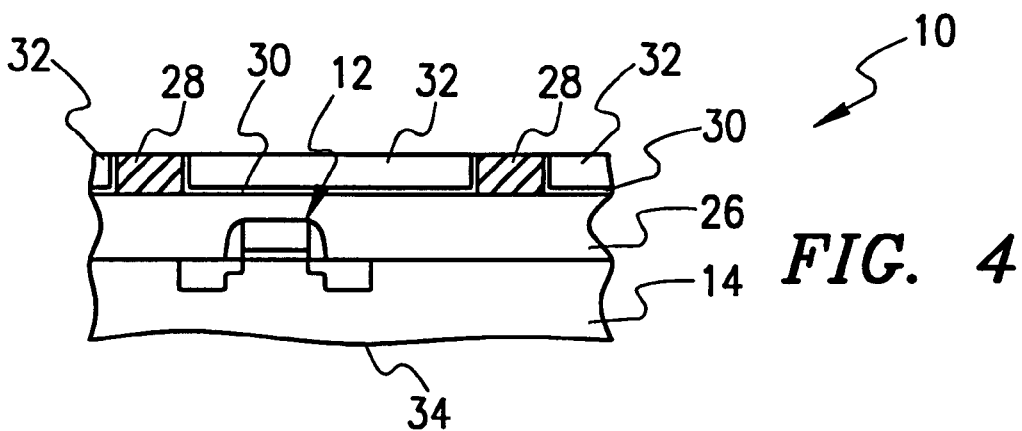
FIG. 4 illustrates the first substrate structure having a transistor formation and metal interlevel lines thereon in preparation for low temperature fabrication of the high density integrated circuit according to the present invention.

Referring now to FIG. 2, metal interlevel lines 28 are formed upon the planar first level dielectric layer 26, including a height dimension in the range on the order of 1,000–3,000 Å. Metal interlevel lines 28 preferably include metals having a melting temperature on the order of less than 500° C. Exemplary metals include, for example, aluminum (Al) and tungsten (W), which form metal-to-metal bonds in the temperature range of between 350–450° C. Metal interlevel lines 28 provide electrical connection between desired transistor formations 12 on the first silicon substrate structure 10. In addition, metal interlevel lines 28 are patterned in preparation for a low temperature fabrication of the high density integrated circuit according to the present invention. Metal interlevel lines 28 may further provide desired interlevel electrical connection between appropriate transistor formations 12 of the first substrate structure 10 and a second substrate structure 50 (FIG. 5), as will be discussed further herein below.

Figure 5:
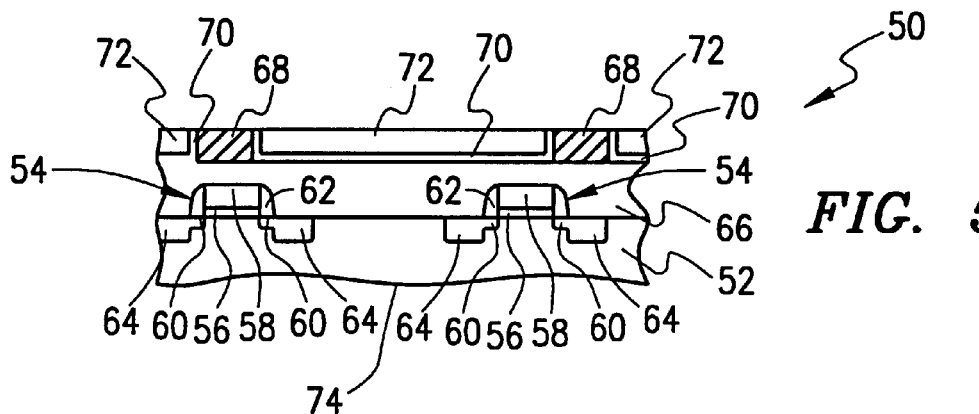
FIG. 5 illustrates a second silicon substrate structure having a transistor formation and metal interlevel lines thereon in preparation for fabrication of the high density integrated circuit according to the present invention.

Subsequent to the formation of desired interlevel metal lines 28 upon planarized interlevel dielectric layer 26, a protective coating layer 30 is deposited upon the top of the substrate structure, covering the metal lines 28 and the planarized interlevel dielectric layer 26. Protective coating layer is preferably conformally deposited and includes a nitride or oxy-nitride. The protective coating layer 30 has a thickness, preferably, in the range on the order of 50–400 Å. After the protective coating layer is deposited, a low-K dielectric layer 32 is conformally deposited thereon. The low-K dielectric layer is deposited to have a thickness on the order of greater than the height dimension of the metal interlevel lines 28. The thickness of low-K dielectric layer 32 is in the range on the order of 2,000 to 10,000 Å. The low-K dielectric layer 32 is then planarized using any suitable planarization technique known in the art, such as, chemical mechanical polishing. The low-K dielectric layer 32 is planarized down until the metal interlevel lines 28 are exposed. The metal interlevel lines 28 are exposed for rendering the same available for being bonded with corresponding metal interlevel lines of a second substrate structure 50 as shown in FIG. 5 and to be further discussed herein with respect to FIG. 6.

Low-K dielectric materials, having a dielectric constant between 1–3.8, provide a number of unique benefits to the present invention. Air has a dielectric constant or K-value of 1. The low-K dielectric material layer of the semiconductor IC device structure according to the present invention is preferably a conformally deposited layer. In addition, the low-K dielectric material layer is preferably formed with some type of fluorine incorporation, such as $SiF_4$, as one possibility for example. Alternatively, the low-K dielectric material may include spin-on type materials, such as spin-on glass having a fluorine incorporation.

As discussed above, the low-K material preferably includes a deposition type and/or spin-on type material having a fluorine component. With respect to the low-K materials, fluorine is introduced into a standard dielectric deposition process or a standard spin-on process. Formation of a standard spin-on glass layer is well known in the art. For example, with a standard oxide deposition process, an overall addition of fluorine into the oxide will significantly lower the dielectric K value thereof, for example, in the range of 3.0 to 3.8. The low-K material may further include plastic type polymers, which have an even lower K value in the range of 2.0 to 3.5. Furthermore, any dielectric material with fluorine is caustic to metal line widths, whereas non-fluorine incorporated dielectric materials are non-caustic to metal line widths. As indicated above, protective layer 30 provides a suitable protective coating, as necessary, for protecting the metal lines 28 which are present on the silicon substrate structure 10 during formation of the low-K dielectric material layer 32. Examples of low-K fluorine incorporated dielectric materials include for example, fluorosilicate glass (FSG), silicon oxyfluoride (FxSiOy), hydrogen silsesquioxane, fluorinated polysilicon, polyphenylquinoxaline, polyquinoline, methysilsesquixane polymer, and fluoropolymide.

The low-K dielectric material for use with the silicon substrate structure 10 according to the present invention may also be made by replacing silane ($SiH_4$) with $SiF_4$ in a standard film deposition, which results in the production of a low-K F type film (which is caustic) in a deposition plasma reaction. The low-K material may also be formed by any deposition from a fluorine containing ambient (i.e., F-containing ambient) such that a fluorine concentration in the range of 3–20 atom percent is achieved. With F-based films, a K value in the range of 3.0–3.8 is achievable, either from a deposition type formation or a spin-on type formation. Plastic type polymers provide a lower K value in the range of 2.0–3.5.

Subsequent to the formation of the planarized low-K dielectric layer upon substrate structure 10, a second protective coating (not shown) is provided upon the planarized low-K dielectric layer 32. The second protective coating includes any suitable protective material which can be subsequently removed after its intended purpose is fulfilled. For example, such a protective material may include photoresist, nitride, and/or silicon nitride. The second protective coating has a relative thickness in the range on the order of 5,000 to 30,000 Å and provides protection during a planarization process of a backside 34 of the silicon substrate 14. That is, silicon substrate 14 is planarized or polished to approximately one-half of the original substrate thickness. Planarization or polishing of substrate 14 can be accomplished using techniques known in the art, such as, chemical-mechanical planarization or any other suitable abrasive removal conducted in a controlled fashion. Subsequent to the planarization of the silicon substrate 14, the protective coating used during the planarization step is removed using a suitable removal technique.

Referring now to FIG. 5, a second silicon substrate structure 50 includes a silicon substrate 52 having a thickness on the order of 725 μm. Silicon substrate 52 preferably includes high performance transistor devices 54 formed thereon, using transistor formation techniques as discussed herein above with respect to formation of transistor device 12. Transistor devices 54 can include any desired high performance transistor devices having a gate oxide 56, gate electrode 58, lightly doped drain (ldd) regions 60, sidewall spacers 62, and source/drain regions 64. Transistor devices 54 are further formed in accordance with a desired circuit implementation. Suitable local interconnect wiring or metal lines (not shown) may be included between transistor devices 54 on the surface of substrate 52 as may be required for a particular circuit implementation. Subsequent to the transistor formation, a first level dielectric layer 66, such as oxide, is deposited upon the transistor formations 54. The first level dielectric layer 66 is then planarized using suitable planarization techniques known in the art, such as, chemical mechanical polishing. Planarized dielectric layer 66 has a relative thickness in the range on the order 2,000 to 10,000 Å.

Referring still to FIG. 5, metal interlevel lines 68 are formed upon the planar first level dielectric layer 66 similarly as discussed herein above with respect to formation of metal interlevel lines 28. That is, formation of metal interlevel lines can be accomplished by deposition of a blanket layer of desired metal, to a height dimension in the range on the order of 1,000–3,000 Å, followed by an low appropriate patterning and etching steps to define the desired metal interlevel lines. Metal interlevel lines 68 preferably include metals having a melting temperature on the order of less than 500° C., for example, Al or W. Metal interlevel lines 68 provide electrical connection between desired transistor formations 54 on the second substrate structure 50. In addition, metal interlevel lines 68 are patterned in preparation for a low temperature fabrication of the high density integrated circuit according to the present invention. Metal interlevel lines 68 may further provide desired interlevel electrical connection between appropriate transistor formations 12 of the first substrate structure 10 (FIG. 4) and second substate structure 50 (FIG. 5), as will be discussed further herein below.

Subsequent to the formation of desired interlevel metal lines 68 upon planarized interlevel dielectric layer 66, a protective coating layer 70 is deposited upon the top of the substrate structure, covering the metal lines 68 and the planarized interlevel dielectric layer 66. Protective coating layer 70 is preferably conformally deposited and includes a nitride or oxy-nitride. The protective coating layer 70 further has a relative thickness, preferably, in the range on the order of 50 to 400 Å.

After the protective coating layer 70 is deposited, a low-K dielectric layer 72 is conformally deposited thereon. The low-K dielectric layer 72 is deposited to have a thickness on the order of greater than the height dimension of the metal interlevel lines 68. The thickness of low-K dielectric layer 72 is in the range on the order of 2,000 to 10,000 Å. The low-K dielectric layer 72 is then planarized using any suitable planarization technique, such as, chemical mechanical polishing. The low-K dielectric layer 72 is planarized down until the metal interlevel lines 68 are exposed. The metal interlevel lines 68 are exposed for rendering the same available for being bonded with corresponding metal interlevel lines 28 of the first substrate structure 10 to be further discussed herein with respect to FIG. 6.

Subsequent to the formation of the planarized low-K dielectric layer 72 upon substrate structure 50, a second protective coating (not shown) is provided upon the planarized low-K dielectric layer 72. The second protective coating includes any suitable protective material which can be subsequently removed after its intended purpose is fulfilled. For example, such a protective material may include photoresist, nitride, and/or silicon nitride. The second protective coating has a relative thickness in the range on the order of 5,000 to 30,000 Å and provides protection during a planarization process of a backside 74 of the silicon substrate 52. That is, silicon substrate 52 is planarized or polished to approximately one-half of the original substrate thickness. Planarization or polishing of substrate 52 can be accomplished using techniques known in the art, such as, chemical-mechanical planarization or any other suitable abrasive removal conducted in a controlled fashion. Subsequent to the planarization of the silicon substrate 52, the protective coating used during the planarization step is removed using a suitable removal technique.

Figure 6:
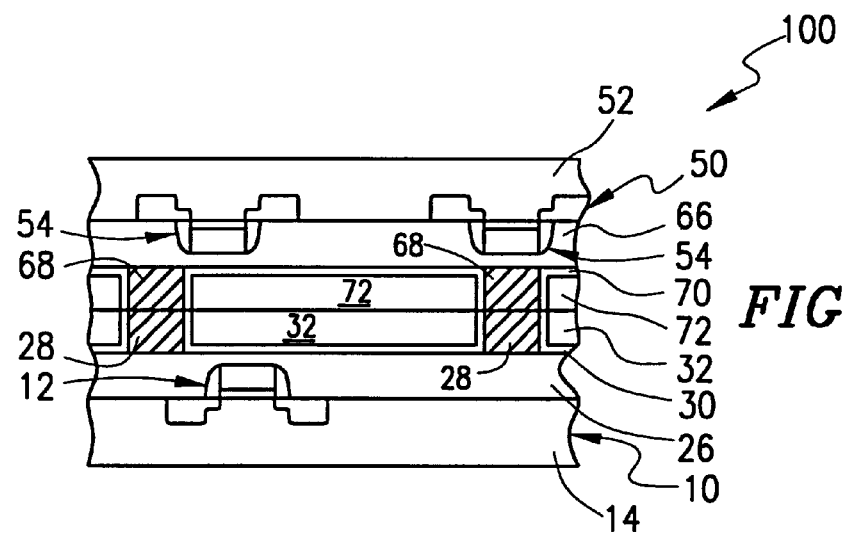
FIG. 6 illustrates the first and second silicon substrate structures bonded together at respective interlevel metal lines for forming the high density integrated circuit in accordance with the present invention.

Upon preparation of the first substrate structure 10 and the second silicon substrate structure 50 as outline herein above, fabrication of the high density integrated circuit 100, as shown in FIG. 6, continues with the step of inverting the second silicon substrate structure 50 relative to the first silicon substrate structure 10, with appropriate alignment between desired metal interlevel lines 28 of the first substrate structure 10 with corresponding desired metal interlevel lines 68 of the second substrate structure 50. In addition, once inverted, low-K dielectric layer 72 of structure 50 is placed in contact with low-K dielectric layer 32 of structure 10. The two substrate structures are then bonded together using an appropriate low temperature anneal, wherein the bonding is accomplished through metal lines 28 with corresponding aligned metal lines 68. Preferably, the dual substrate structure is annealed using a rapid thermal anneal (RTA) in the range of 350–550° C., the particular temperature depending upon a type of metal used, further for a time duration on the order of 30–60 seconds. Alternatively, the dual structure can be annealed using a conventional heating tube approach at a lower temperature in the range of 350 to 500° C. for a time duration on the order of 30 to 60 minutes.

The high density integrated circuit structure 100 shown in FIG. 6 provides for multiple individually formed layers of transistor formations in a single integrated circuit structure. The transistor formations of a first semiconductor substrate structure are formed in accordance with a desired circuit implementation. The transistor formations of a second semiconductor substrate structure are formed in accordance with a second desired circuit implementation, wherein the first and second desired circuit implementations together provide for an intended overall integrated circuit function. Subsequent to transistor formations on each substrate, a planarized first level dielectric layer is provided over the transistor formations. Subsequently, desired metal interlevel lines are formed thereon, followed by a protective coating, and a low-K dielectric material layer. The low-K dielectric material is deposited and then planarized to expose the underlying metal interlevel lines. As noted herein above, the low-K dielectric material contains a fluorine species, wherein the fluorine species is highly corrosive to silicon and metal lines. The protective coating is provided above the metal interlevel lines of each structure prior to deposition of the low-K dielectric material layer on each corresponding substrate structure. The protective coating protects the underlying metal lines from any adverse corrosive affects of the low-K dielectric material layer.

The metal interlevel lines of each substrate structure provide for attachment of the respect structures with one another at a relatively low temperature, thus protecting the transistor formations of each respective substrate structure. In addition, the low-K dielectric material layer of each structure provides the advantage of reducing adverse capacitive effects between transistor formations of the first substrate structure 10 relative to the transistor formations of the second substrate structure 50 of the high density integrated circuit structure 100. The reduction of adverse capacitive effects is highly advantageous in the high density integrated circuit structure 100 according to the present invention. The keeping of capacitive effects to a minimum, i.e., as low as possible, is very important for high speed integrated circuit performance. In addition, minimal capacitive effects assist in the improvement of transistor device operation speeds.

The present invention further provides an integrated circuit package having a thickness on the order of an original single substrate thickness. The present invention also advantageously enables a packing density of an integrated circuit application to be essentially doubled over the density of that of a single substrate integrated circuit. With the increased packing density, the present invention enables placement of transistor devices in closer proximity within an overall integrated circuit application. As a result, a wiring delay time associated with long wiring lines between transistor devices of a particular circuit configuration is advantageously reduced. The increased packaging density is still further accomplished while minimizing any adverse capacitive effects as discussed herein above.

Some examples of possible application for the high density integrated circuit structure 100 according to the present invention includes microprocessor and memory device applications. In a first example, the first substrate structure and the second substrate structure may be designed to cooperate together for performing the operations of a microprocessor. Alternatively, the first substrate structure may perform the function of a microprocessor, while the second substrate structure may perform the function of a memory. Still further, in the current state of the art, semiconductor memory devices include outputs on an edge of a memory circuit. High density is thus important with respect to a reduced integrated circuit size, especially with respect to memory devices. In yet another example, a cache memory may be constructed in one of the substrate structures of the high density integrated circuit structure 100. Other portions of a memory circuit to be connected integral with the cache memory of the first substrate may be included in the other substrate structure. In addition, while the low-K dielectric material layer provides for reduced overall adverse capacitive effects, in the case of memory devices, memory cells of one substrate structure may be appropriately offset from the memory cells of the second substrate by an amount necessary for further minimizing any adverse capacitive effects.

Figure 7:
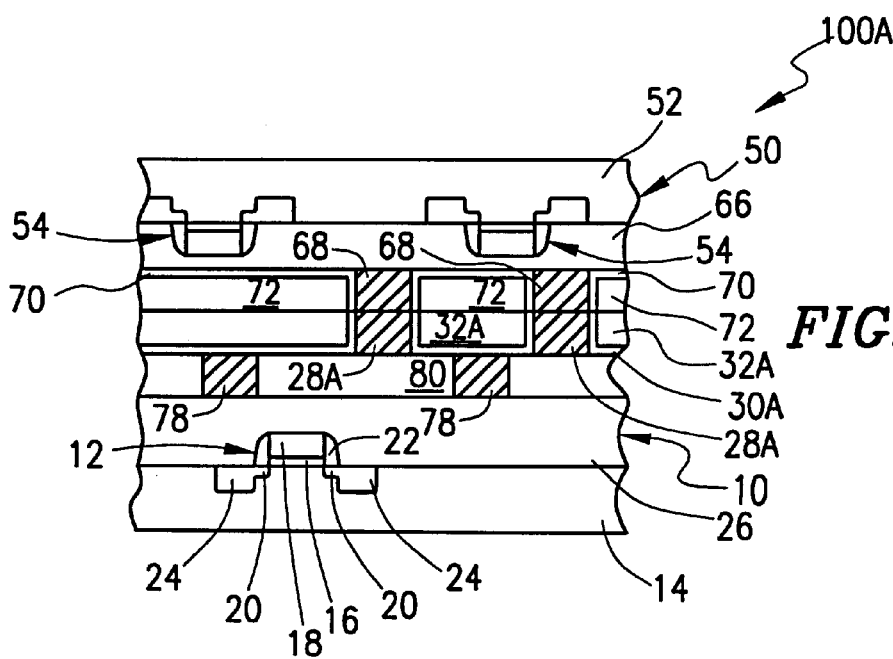
FIG. 7 illustrates an alternate embodiment of a first and second substrate structure having a transistor formation and interlevel metal lines thereon for forming the high density integrated circuit according to the present invention.

Turning now to FIG. 7, a silicon substrate structure 10A is shown in the high density integrated circuit structure 100A in accordance with an alternate embodiment according to the present invention. Silicon substrate structure 10A as shown in FIG. 7 is used in place of the structure 10 of FIG. 6. Alternatively, silicon substrate structure 10A could also be used in place of the structure 50.

Structure 10A is similar to structures 10 and 50, with the exception of differences as noted in the following. Silicon substrate structure 10A includes a silicon substrate 14 having a thickness on the order of 725 μm. Silicon substrate 14 preferably includes high performance transistor devices 12 (only one shown) formed thereon, using transistor formation techniques as discussed herein above. The high performance transistor devices 14 can include any desired transistor devices, for example, having a gate oxide 16, gate electrode 18, lightly doped drain (ldd) regions 20, sidewall spacers 22, and source/drain regions 24. Transistor devices 12 (only one shown) are further formed in accordance with a desired circuit implementation. Suitable local interconnect wiring or metal lines (not shown) may also be included between transistor devices on the surface of substrate 14 as may be required for a particular circuit implementation. Subsequent to the transistor formation, a first level dielectric layer 26, such as oxide, is deposited upon the transistor formations 12. The first level dielectric layer 26 is then planarized using suitable planarization techniques known in the art, such as, chemical mechanical polishing. Dielectric layer 26 has a relative thickness in the range on the order of 2,000 to 10,000 Å, preferably 5,000 Å.

Referring still to FIG. 7, metal lines 78 are formed upon the planar first level dielectric layer 26 in a similar manner as discussed herein above with respect to metal lines 28. Metal interlevel lines 78, for example, may provide electrical connection between desired transistor formations 12 on the alternate substrate structure 10A. Subsequent to the metal line 78 formations, a second level dielectric layer 80, such as oxide, is deposited upon the metal line formations 78. The dielectric layer 80 is then planarized down to metal line formations 78, using any suitable planarization technique. Dielectric layer 80 has a relative thickness in the range on the order of 2,000 to 10,000 Å, preferably 5,000 Å.

Subsequent to the formation of metal line formations 78 and planarized dielectric layer 80, referring still to FIG. 7, metal interlevel lines 28A are formed upon the planarized dielectric layer 80. Formation of metal interlevel lines 28A is similar to that as shown and described with respect to metal interlevel lines 28 of FIG. 4. In addition, metal lines 28A are patterned in preparation for a low temperature fabrication of the high density integrated circuit according to the alternate embodiment of the present invention. Metal interlevel lines 68 may further provide desired interlevel electrical connection between appropriate transistor formations 12 of the substrate structure 10A and second substate structure 50. In addition, subsequent to the formation of desired interlevel metal lines 28A upon planarized dielectric layer 26, a protective coating layer 30A and low-K dielectric layer 32A are formed similarly as in the embodiment shown and described with respect to FIG. 4. Still further, a backside surface of substrate 14 is then planarized.

There has thus been shown a high density, high performance integrated circuit structure and method of making the same which utilize low temperature metal bonding combined with incorporation of a low-K dielectric material. High temperatures, in the range of 700–900° C., which are otherwise destructive and damaging to high performance transistor device formations, are advantageously avoided with the method of the present invention. Still further, the integrated circuit structure of the present invention provides for minimal adverse capacitive effects. Such a method and apparatus are highly advantageous in the manufacture of high density microprocessor and/or semiconductor memory device applications. The density of the resultant integrated circuit is greatly enhanced due to the utilization of twice the single crystal silicon area obtained using the first and second silicon substrate structures.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit and scope of the present invention as limited solely by the appended claims.

What is claimed is:

1. A method of making a high density integrated circuit comprising the steps of:

provoding a first silicon substrate structure having semiconductor device formations in accordance with a first circuit implementation and metal interlevel lines disposed on a top surface thereof, the first silicon substrate further having a planarized low-K dielectric disposed between the metal interlevel lines and a protective coating separating the metal interlevel lines from the low-K dielectric, the metal interlevel lines having a melting temperature in the range on the order of less than 500° C. and the low-K dielectric having a dielectric K-value in the range of 2.0–3.8;

providing a second silicon substrate structure having semiconductor device formations in accordance with a second circuit implementation and metal interlevel lines disposed on a top surface thereof, the second silicon substrate further having a planarized low-K dielectric disposed between the metal interlevel lines and a protective coating separating the metal interlevel lines from the low-K dielectric, the metal interlevel lines having a melting temperature in the range on the order of less than 500° C. and the low-K dielectric having a dielectric K-value in the range of 2.0–3.8;

bonding the first silicon substrate structure to the second silicon substrate structure at respective metal interlevel lines of the first and second silicon substrate structures; and wherein the low-K dielectric of the first silicon substrate structure includes a low-K dielectric material selected from the group consisting of a deposition type material having a fluorine component and a spin-on type material having a fluorine component.

2. A method of making a high density integrated circuit comprising the steps of:

providing a first silicon substrate structure having semiconductor device formations in accordance with a first circuit implementation and metal interlevel lines disposed on a top surface thereof, the first silicon substrate further having a planarized low-K dielectric disposed between the metal interlevel lines and a protective coating separating the metal interlevel lines from the low-K dielectric, the metal interlevel lines having a melting temperature in the range on the order of less than 500° C. and the low-K dielectric having a dielectric K-value in the range of 2.0–3.8;

providing a second silicon substrate structure having semiconductor device formations in accordance with a second circuit implementation and metal interlevel lines disposed on a top surface thereof, the second silicon substrate further having a planarized low-K dielectric disposed between the metal interlevel lines and a protective coating separating the metal interlevel lines from the low-K dielectric, the metal interlevel lines having a melting temperature in the range on the order of less than 500° C. and the low-K dielectric having a dielectric K-value in the range of 2.0–3.8;

bonding the first silicon substrate structure to the second silicon substrate structure at respective metal interlevel lines of the first and second silicon substrate structures; and wherein the low-K dielectric of the first silicon substrate structure includes a low-K fluorine incorporated dielectric material selected from the group consisting of fluorosilicate glass (FSG), silicon oxyfluoride (FxSiOy), hydrogen silsesquioxane, fluorinated polysilicon, polyphenylquinoxaline, polyquinoline, methysilsesquixane polymer, and fluoro-polymide.

3. A method of making a high density integrated circuit comprising the steps of:

providing a first silicon substrate structure having semiconductor device formations in accordance with a first circuit implementation and metal interlevel lines disposed on a top surface thereof, the first silicon substrate further having a planarized low-K dielectric disposed between the metal interlevel lines and a protective coating separating the metal interlevel lines from the low-K dielectric, the metal interlevel lines having a melting temperature in the range on the order of less than 500° C. and the low-K dielectric having a dielectric K-value in the range of 2.0–3.8;

providing a second silicon substrate structure having semiconductor device formations in accordance with a second circuit implementation and metal interlevel lines disposed on a top surface thereof, the second silicon substrate further having a planarized low-K dielectric disposed between the metal interlevel lines and a protective coating separating the metal interlevel lines from the low-K dielectric, the metal interlevel lines having a meltings temperature in the range on the order of less than 500° C. and the low-K dielectric having a dielectric K-value in the range of 2.0–3.8;

bonding the first silicon substrate structure to the second silicon substrate structure at respective metal interlevel lines of the first and second silicon substrate structures; and wherein the low-K dielectric of the first silicon substrate structure includes a low-K dielectric material formed by a deposition from a fluorine containing ambient such that a fluorine concentration in the range of 3–20 atom percent is achieved.

4. A method of making a high density integrated circuit comprising the steps of:

providing a first silicon substrate structure having semiconductor device formations in accordance with a first circuit implementation and metal interlevel lines disposed on a top surface thereof, the first silicon substrate further having a planarized low-K dielectric disposed between the metal interlevel lines and a protective coating separating the metal interlevel lines from the low-K dielectric, the metal interlevel lines having a melting temperature in the range on the order of less than 500° C. and the low-K dielectric having a dielectric K-value in the range of 2.0–3.8;

providing a second silicon substrate structure having semiconductor device formations in accordance with a second circuit implementation and metal interlevel lines disposed on a top surface thereof, the second silicon substrate further having a planarized low-K dielectric disposed between the metal interlevel lines and a protective coating separating the metal interlevel lines from the low-K dielectric, the metal interlevel lines having a melting temperature in the range on the order of less than 500° C. and the low-K dielectric having a dielectric K-value in the range of 2.0–3.8;

bonding the first silicon substrate structure to the second silicon substrate structure at respective metal interlevel lines of the first and second silicon substrate structures; and planarizing a backside of a silicon substrate of the first silicon substrate structure subsequent to a formation of the metal interlevel lines, protective coating and low-K dielectric disposed on the top surface thereof; and planarizing a backside of a silicon substrate of the second silicon substrate structure subsequent to a formation of the metal interlevel lines, protective coating, and low-K dielectric layer disposed on the top surface thereof.

5. A method of making a high density integrated circuit comprising the steps of:

providing a first silicon substrate structure having semiconductor device formations in accordance with a first circuit implementation and metal interlevel lines disposed on a top surface thereof, the first silicon substrate further having a planarized low-K dielectric disposed between the metal interlevel lines and a protective coating separating the metal interlevel lines from the low-K dielectric, the metal interlevel lines having a melting temperature in the range on the order of less than 500° C. and the low-K dielectric having a dielectric K-value in the range of 2.0–3.8;

providing a second silicon substrate structure having semiconductor device formations in accordance with a second circuit implementation and metal interlevel lines disposed on a top surface thereof, the second silicon substrate further having a planarized low-K dielectric disposed between the metal interlevel lines and a protective coating separating the metal interlevel lines from the low-K dielectric, the metal interlevel lines having a melting temperature in the range on the order of less than 500° C. and the low-K dielectric having a dielectric K-value in the range of 2.0–3.8;

bonding the first silicon substrate structure to the second silicon substrate structure at respective metal interlevel lines of the first and second silicon substrate structures; and the metal interlevel lines of the first silicon substrate structure include metal lines selected from the group consisting of aluminum and tungsten, and the metal interlevel lines of the second silicon substrate structure include metal lines selected from the group consisting of aluminum and tungsten.

6. The method of claim 2, wherein the protective coating of the first silicon substrate structure includes a nitride layer.

7. A method of making a high density integrated circuit comprising the steps of:

providing a first silicon substrate structure having semiconductor device formations in accordance with a first circuit implementation and metal interlevel lines disposed on a top surface thereof, the first silicon substrate further having a planarized low-K dielectric disposed between the metal interlevel lines and a protective coating separating the metal interlevel lines from the low-K dielectric, the metal interlevel lines having a melting temperature in the range on the order of less than 500° C. and the low-K dielectric having a dielectric K-value in the range of 2.0–3.8;

providing a second silicon substrate structure having semiconductor device formations in accordance with a second circuit implementation and metal interlevel lines disposed on a top surface thereof, the second silicon substrate further having a planarized low-K dielectric disposed between the metal interlevel lines and a protective coating separating the metal interlevel lines from the low-K dielectric, the metal interlevel lines having a melting temperature in the range on the order of less than 500° C. and the low-K dielectric having a dielectric K-value in the range of 2.0–3.8;

bonding the first silicon substrate structure to the second silicon substrate structure at respective metal interlevel lines of the first and second silicon substrate structures; and the protective coating of the first silicon substrate structure includes a dual layer of an oxide and a nitride.

8. The method of claim 1, wherein bonding includes low temperature bonding in the range on the order of 350–550° C.

9. The method of claim 2, wherein the protective coating of the first silicon substrate structure includes a nitride layer.

10. The method of claim 3, wherein the protective coating of the first silicon substrate structure includes a nitride layer.

11. The method of claim 4, wherein the protective coating of the first silicon substrate structure includes a nitride layer.

12. The method of claim 5, wherein the protective coating of the first silicon substrate structure includes a nitride layer.

13. The method of claim 2 wherein bonding includes low temperature bonding in the range on the order of 350–550° C.

14. The method of claim 3, wherein bonding includes low temperature bonding in the range on the order of 350–550° C.

15. The method of claim 4, wherein bonding includes low temperature bonding in the range on the order of 350–550° C.

16. The method of claim 5, wherein bonding includes low temperature bonding in the range on the order of 350–550° C.

17. The method of claim 7, wherein bonding includes low temperature bonding in the range on the order of 350–550° C.

* * * * *

UNITED STATES PATENT AND TRADEMARK OFFICE
CERTIFICATE OF CORRECTION

PATENT NO. : 6,080,640
DATED : June 27, 2000
INVENTOR(S) : Gardner et al.

It is certified that error appears in the above-identified patent and that said Letters Patent is hereby corrected as shown below:

Column 6,
Line 62, delete the word "low"

Signed and Sealed this

Thirteenth Day of November, 2001

Attest:

*Nicholas P. Godici*

NICHOLAS P. GODICI
*Attesting Officer*  *Acting Director of the United States Patent and Trademark Office*